United States Patent

Williams

[15] 3,662,188

[45] May 9, 1972

[54] FIELD EFFECT TRANSISTOR DYNAMIC LOGIC BUFFER

[72] Inventor: Thomas A. Williams, Reston, Va.

[73] Assignee: International Business Machines Corporation, Armonk, N.Y.

[22] Filed: Sept. 28, 1970

[21] Appl. No.: 76,183

[52] U.S. Cl. ..............................307/233, 307/205, 307/208, 307/238, 307/246, 307/251

[51] Int. Cl. ..........................................................H03k 19/08

[58] Field of Search ..................307/205, 208, 233, 238, 246, 307/251, 279, 304

[56] References Cited

UNITED STATES PATENTS

| | | | |
|---|---|---|---|
| 3,466,526 | 9/1969 | Cole | 307/251 X |
| 3,535,658 | 10/1970 | Webb | 307/233 X |
| 3,555,298 | 1/1971 | Neelands | 307/251 X |
| 3,509,375 | 4/1970 | Gormley | 307/246 X |
| 3,573,487 | 4/1971 | Polkinghorn | 307/205 |

*Primary Examiner*—Stanley T. Krawczewicz
*Attorney*—Hanifin and Jancin and Theodore E. Galanthay

[57] ABSTRACT

A buffer circuit for interfacing multi-phase dynamic field effect transistor (FET) logic circuits with conventional logic circuits by converting pulsating logic signals to steady-state logic signals. A sampling stage gates the true and complement phases of the pulsating signal at an equilibrium state, thereby converting the pulsating signal to a steady-state level. An output stage detects the steady-state level and provides the output drive. The buffer is fabricated in accordance with FET technology and is placed on the same monolithic chip with the multi-phase FET circuits. Circuits for generating true and complement phases of the pulsating signal are also disclosed.

5 Claims, 8 Drawing Figures

INVENTOR
THOMAS A. WILLIAMS
BY Theodore E. Galanthay
ATTORNEY

FIELD EFFECT TRANSISTOR DYNAMIC LOGIC BUFFER

BACKGROUND OF THE INVENTION

1. Field of the Invention

This is an FET dynamic logic buffer circuit for interfacing multi-phase dynamic logic circuits with conventional FET and/or conventional bi-polar circuits. More specifically, this invention relates to an FET buffer circuit for converting four-phase pulsed signals into steady-state logic signals.

2. Description of the Prior Art

The prior art, in general, has been concerned with large-scale integration (LSI) in which one hundred or more circuits are to be fabricated on a single semiconductor chip. In order to obtain such a high density with relatively low power consumption (which also minimizes heat generation), the use of field effect transistors (FET's) has been proposed. There has been particular interest in metal oxide semiconductor field effect transistors (MOS FET's). Although these circuits are characterized by a high packaging density and relatively low power consumption, they suffer from a relatively very low speed of operation. In order to increase the speed of operation of MOS FET circuits, multi-phase logic was designed. As opposed to conventional logic circuits which are timed by a single clocking pulse, multi-phase logic circuits are timed by a plurality of clocking pulses. Thus, it is possible to have two, four, six and even eight or more clocking pulses, thereby constituting two-phase, four-phase, six-phase and similar multi-phase logic circuits. In this way, a number of circuit operations are performed in parallel instead of the more conventional seriatim approach, thereby multiplying the speed of operation of MOS FET circuits. Increasing the number of phases has resulted in even lower power requirements. However, as the number of phases is increased, additional conducting lines are required lowering the available device density. Taking these various trade-offs into consideration, it has been found that four-phase MOS FET logic circuits are a good compromise for achieving low power, high density, and a high speed of operation.

A significant difficulty with multi-phase (dynamic) MOS FET circuits has been the lack of an efficient and economical method of interfacing them with conventional (steady-state) MOS FET and bi-polar circuits. One specific problem of interfacing has resulted from the fact that MOS FET circuits operate by transferring voltage levels, whereas bi-polar circuits are current driven. Accordingly, the normal output of multi-phase dynamic logic circuits is characterized by a very low energy up-level and a pulsating down-level. Another problem of interfacing has been timing. A still further problem has been occasioned by device incompatability so that as long as the interfacing circuits could not be fabricated from FET technology, separate external circuits and circuit connections were required. The prior art, which is primarily concerned with taking the multi-phase pulsating signals off the MOS FET chip and using various sense amplifiers for amplification, etc. suffers from the need for extra off-chip devices and has difficulties with skew-timing, distortion, as well as noise. Noise is inevitably a significant problem when low-level signals must be transferred from one chip to another. These prior art techniques further suffer from excessive cost.

In addition to the problem of interfacing multi-phase MOS FET logic circuits with bi-polar circuits, there is a problem with the testing of these circuits. Dynamic testing of multi-phase logic is very difficult as is always the case with dynamic testing. The problem is further complicated by the difficulties encountered by the prior art in interfacing appropriate test equipment to a multi-phase dynamic MOS FET logic circuit chip.

SUMMARY OF THE INVENTION

It is, therefore, a primary object of this invention to interface a multi-phase MOS FET logic circuit with either a conventional MOS FET or a bi-polar logic circuit.

It is another object of this invention to convert multi-phase pulsed signals into steady DC logic levels.

It is another object of this invention to fabricate a relatively inexpensive interfacing circuit that is compatible with the MOS FET technology of the multi-phase circuits and on the same chip.

It is a further object of this invention to provide a MOS FET circuit having a high energy output signal.

It is a still further object of this invention to provide both true and complement phases of data to a MOS FET buffer circuit.

Lastly, it is an object of this invention to eliminate the need for dynamically testing multi-phase logic circuits.

In accordance with this invention, there is provided an FET logic circuit providing steady-state output signals in response to a multi-phase pulsating input signal. The buffer providing this interface includes a sampling stage and an output stage. The sampling stage consisting of two FET's receives both the true and complement phases of a pulsating signal. If the particular multi-phase logic circuit to be interfaced does not provide both the true and complement phases of a pulsating signal, MOS FET circuits for accomplishing this are provided. After both the true and complement phases of the signal are made available to the buffer circuit, one of the clock phase pulses is used to gate the signal to the output stage. The particular clock-phase pulse selected is one that occurs when both true and complement phases are at an equilibrium or stable condition. In this way, precharge transients on the input line are not transferred to the output stage and a stable condition exists at the input of the output stage. The output stage, also consisting of two FET's receives the output of the sampling stage and provides a powered steady-state logic output that is indicative of the pulsating logic signal at the input to the buffer.

What is then described is an integrated on-chip buffer circuit capable of converting pulsating logic levels to steady-state DC levels of sufficient energy to drive external bi-polar circuits or to provide logic signals between chips. Direct interfacing between the chip and conventional logic circuits is achieved without the necessity of intermediate strobing, clocking, or conversion circuits. This reduces skewing or timing problems in the interconnection of logic between four-phase logic chips by making the logic levels between chips to a considerable extent phase independent.

The foregoing and other objects, features and advantages of this invention will be apparent from the following more particular description of preferred embodiments of the invention, as illustrated in the accompanying drawings.

DESCRIPTION OF THE PREFERRED EMBODIMENT

Figure 1:
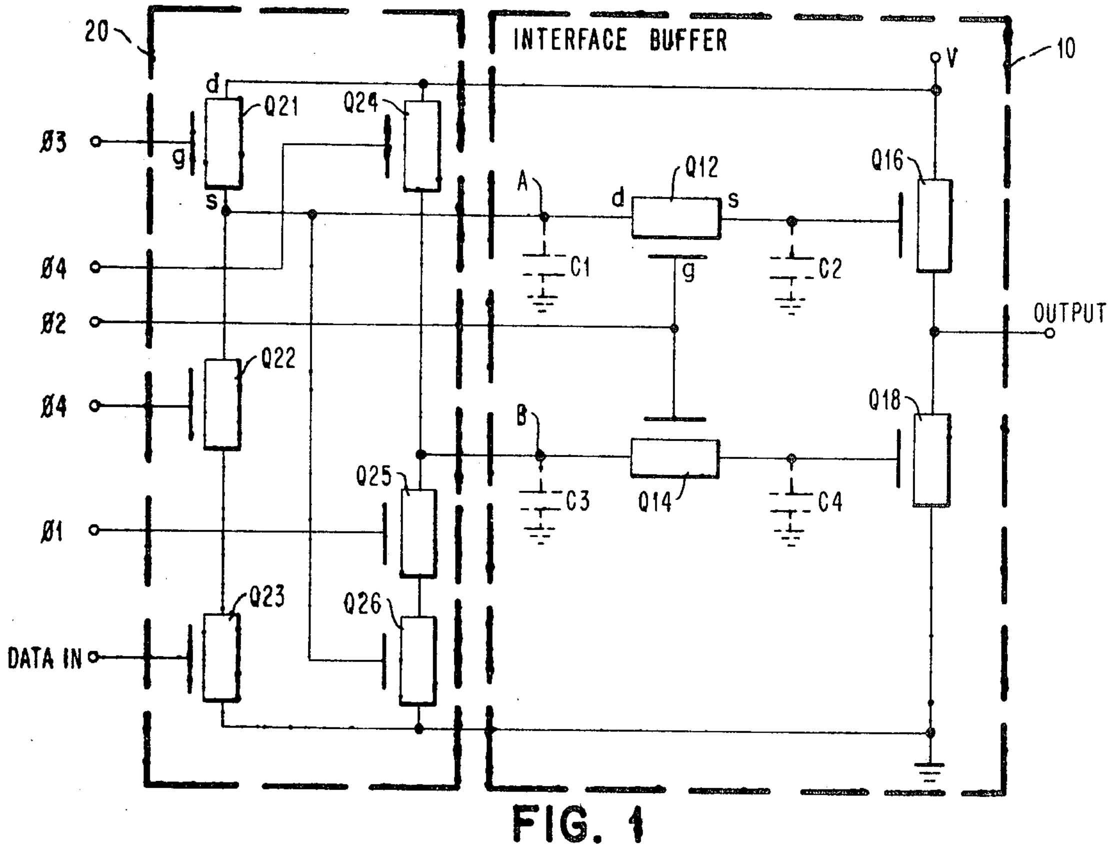
FIG. 1 is a circuit diagram of an embodiment of this invention showing the buffer circuit connected to a circuit for providing the true and complement phases of a pulsating signal.
Figures 1A, 3:
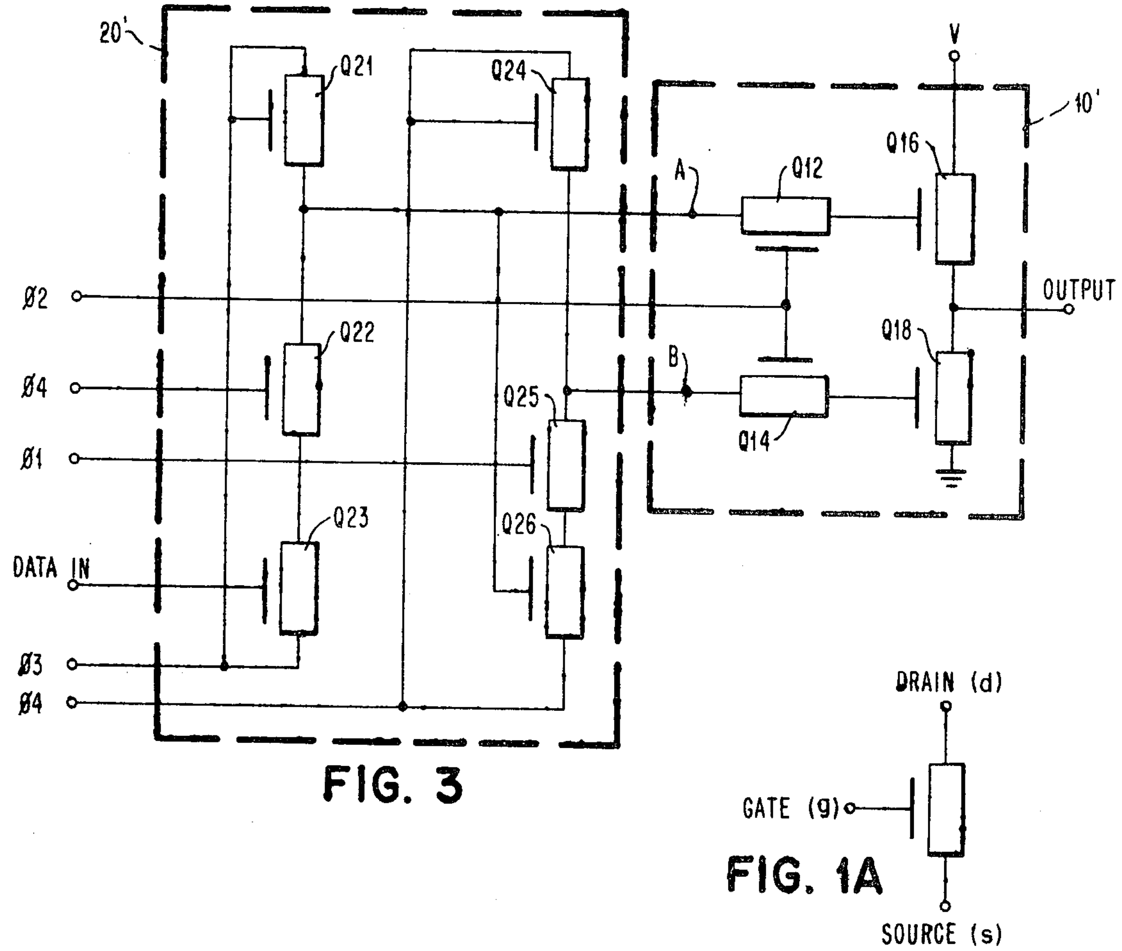
FIG. 1A depicts an FET with the drain, source, and gate regions labeled.
FIG. 3 is an alternate embodiment showing a different circuit for generating true and complement phases of the pulsating signal.

Referring to FIG. 1 there is disclosed buffer circuit 10 connected to true complement generator 20. In this preferred embodiment, buffer circuit 10 consists of a sampling stage and an output stage. The sampling stage is comprised of MOS FET's Q12 and Q14. The output stage consists of MOS FET's Q16 and Q18. The true complement generator consists of MOS FET's Q21, Q22, Q23, Q24, Q25, and Q26. Each FET has a gate region, source and drain. FIG. 1A shows the relative positions of the source, drain and gate regions in a circuit. The particular MOS FET's utilized in this invention are completely bi-directional so that the source and drain are interchangeable. Nevertheless, they have been labeled to clarify the explanation of the preferred embodiments.

Referring back to FIG. 1, in the true complement generator, the source of Q21 is connected to the drain of Q22 which in turn, has its source connected to the drain of Q23, the source of Q23 being connected to ground. The drain of Q21 is also connected to the drain of Q24 which in turn, has it source connected to the drain of Q25, which in turn, has its source connected to the drain of Q26, which has its source connected to ground. A positive voltage is applied to the drain of Q21 and Q24. The common point between the source of Q21 and the drain of Q22 is also connected to the gate of Q26 and carries one phase of the pulsating signal. The other phase of the pulsating signal is taken from a common point between the source of Q24 and the drain of Q25. The pulsating input signal is received at the gate of Q23 as shown.

The interface buffer 10 receives one phase of the signal at the drain of Q12 and the other phase of the signal at the drain of Q14. The gates of Q12 and Q14 are connected together and adapted to receive a clocking pulse. The source of Q12 is connected to the gate of Q16, while the source of Q14 is connected to the gate of Q18. The source of Q16 is connected to the drain of Q18, the final output being taken from a common point along this connection. The drain of Q16 is connected to a source of positive potential, while the source of Q18 is connected to ground.

The capacitors C1, C2, C3 and C4 are drawn in phantom lines to show that they are usually not actual capacitive components. Rather, these capacitors represent the parasitic capacitance normally designed into the circuit. The very basis for the operation of field effect transistors is the transfer of charge between the various parasitic capacitances. The capacitive values vary with different technologies and layout schemes. A generalized discussion is found in the description of FIG. 7. In the particular process utilized by applicant, the following specific values are given by way of example. These parasitic capacitances are a distributed capacitance primarily determined by the following three factors. First, there is a voltage dependent capacitance of approximately 0.05 pf per sq. mil associated with the pn junction diffusion at the gate/source and gate/drain junctions. A second capacitance of approximately 0.038 pf per sq. mil is associated with the metallic conducting lines (such as aluminum) connecting the various devices together. Lastly, the most significant capacitance of approximately 0.45 pf per sq. mil is the metallization covering the gate region of the field effect transistor. In order for the circuit of FIG. 1 to operate properly, it is necessary that the capacitance of C1 be at least four times that of C2. Similarly, the capacitance of C3 must be at least four times the capacitance of C4. This relationship is determined by the formula:

$$\text{Voltage (in-final)} = \frac{C1}{C1+C2} \times \text{voltage (in-initial)}$$

A ratio of 4 to 1 thus provides that a minimum of 80 percent of the initial voltage is transferred through FET's Q12 and/or Q14.

Refer now to FIG. 3 for an alternate embodiment from that disclosed in FIG. 1. Corresponding components have been labeled with corresponding reference numerals. The structure of buffer 10 is identical in every respect and need not be again described in detail. Since the parasitic capacitances are not actual capacitors, they have been omitted from this drawing. There is a distinction to be noted in the structure of the true complement generator. The source of Q23 is now connected to both the drain and gate of Q21 and is also connected to one of the clocking pulses. Similarly, the source of Q26 is now connected to both the drain and gate of Q24 and also connected to one of the clocking pulses. The circuits of FIG. 3 and FIG. 1 are identical in every other respect.

Figures 5, 7:
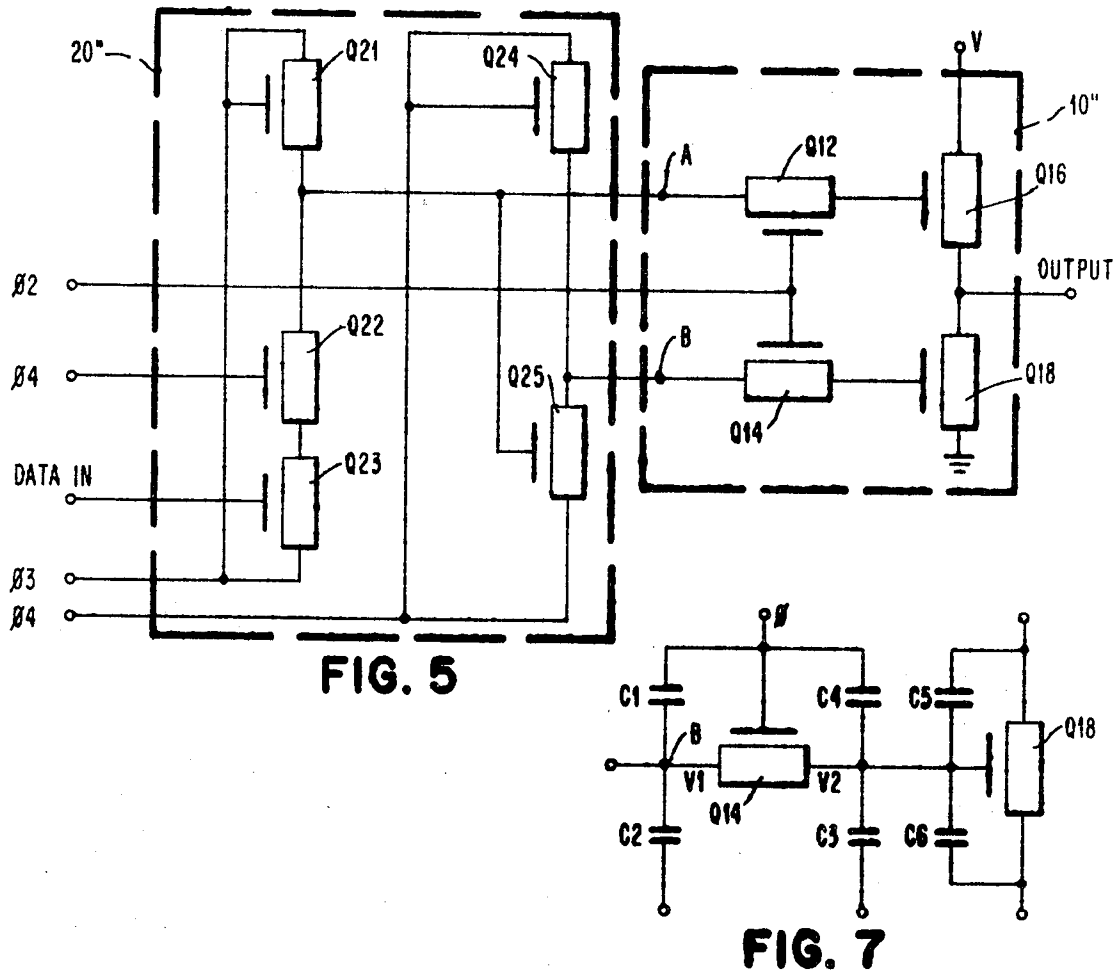
FIG. 5 is a still further alternate embodiment of a circuit for generating true and complement phases of pulsating signals.
FIG. 7 is a partial equivalent circuit showing the various parasitic capacitances associated with the buffer circuit.
Figure 6:
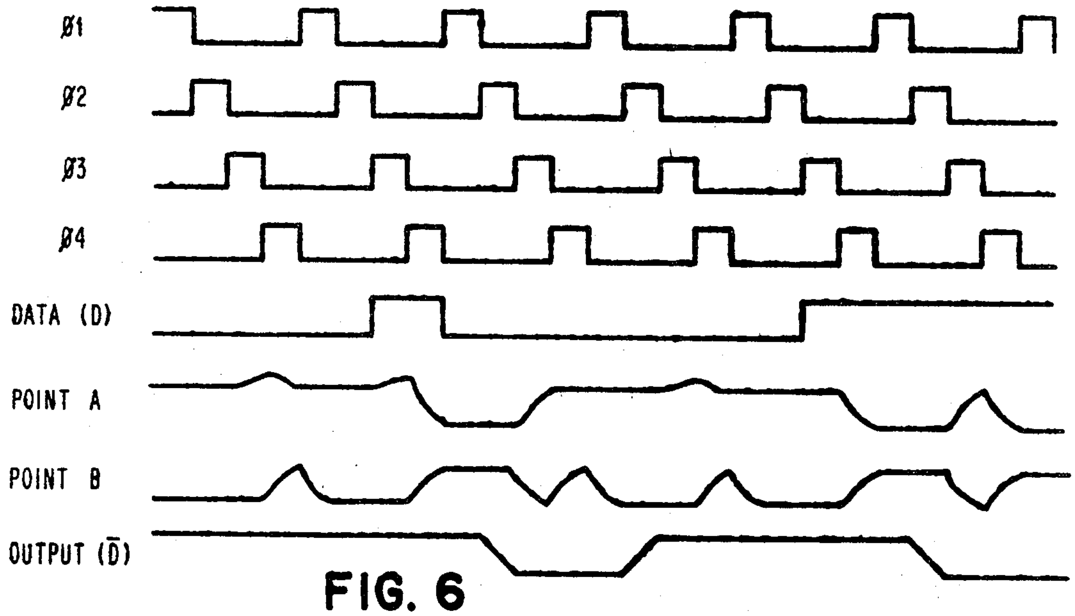
FIG. 6 is a series of waveform diagrams depicting the operation of the circuit of FIG. 5.

Refer now to FIG. 5 showing a still further alternate embodiment of the true complement generator. Corresponding components have again been labeled with corresponding reference numerals. In this embodiment, the gate and drain of Q21 and the source of Q23 are connected in common to one of the gating pulses. Also the gate and drain of Q24 and the gate of Q22 are connected to a common gating pulse.

Moreover, the common node of Q21 and Q22 is connected to the gate of Q25 and provides one of the phases of the pulsating output signal. As a further distinction from the previous embodiments, the other phase of the pulsating output signal is taken from a common point between the source of Q24 and the drain of Q25, Note that in both the embodiment of FIG. 3 and the embodiment of FIG. 5, there are no steady-state voltages applied to the true complement generator.

Refer now to FIG. 7 for a more rigorous explanation of the capacitive ratios. FIG. 7 shows one half of the buffer circuit. The FET's have been labeled with reference numeral corresponding to other figures, but there is no correspondence in the numbering of the parasitic capacitances. Level preservation can be approximated by the following equations:

Clock On $$V1 = V2 = V1i\,\frac{C1+C2}{C1+C2+C3+C4'} + V2i\,\frac{C3+C4'}{C1+C2+C3+C4'} + V\phi\,\frac{C1+C4'}{C1+C2+C3+C4'}$$

Clock Off $$V1 = V1i\,\frac{C2}{C1+C2}$$

$$V2 = \frac{C3}{C3+C4'}\left[V1i\,\frac{C1+C2}{C2+C3} + V2i\,\frac{C3+C4'}{C2+C3} + VT\,\frac{C1+C4'}{C2+C3} - VT\,\frac{C4'}{C3}\right]$$

where $V1$, $V2$ = Final value $V1i$, $V2i$ = Initial value $C4' = C4 + C5 + C6$ for circuit A $C4' = C4 + C5$ for circuit B These relationships can be reduced to the following simple expression $$C2 = 4C3 = 16\ C4'$$

OPERATION

Figure 2:
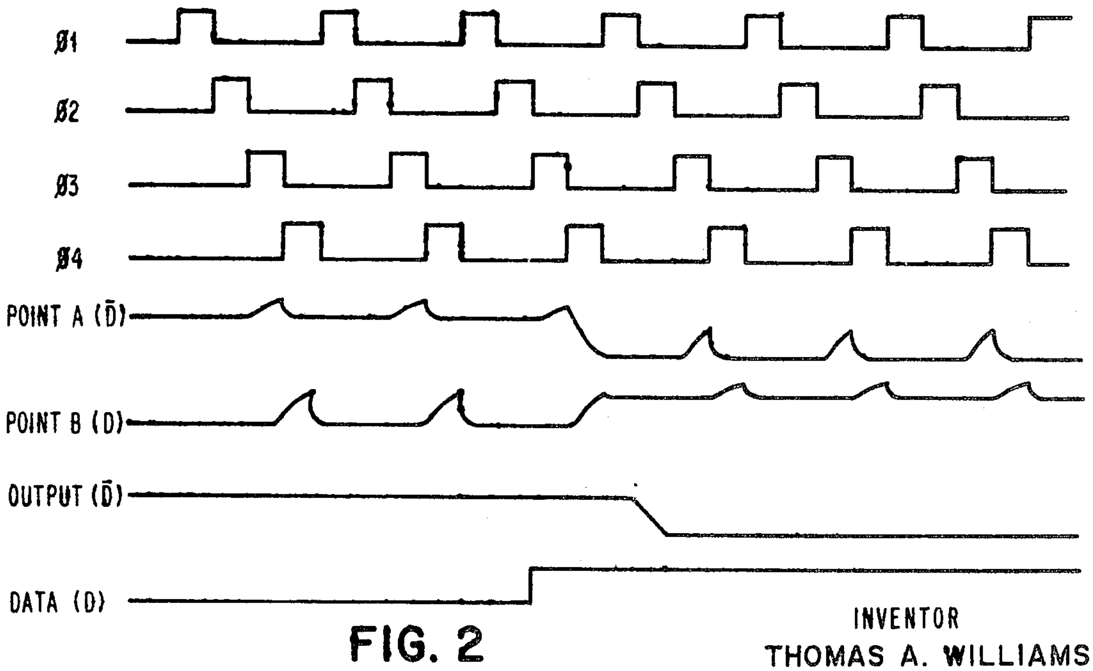
FIG. 2 is a waveform diagram depicting the operation of the circuit of FIG. 1.

In operation, the buffer circuit is shown converting a four-phase pulsating signal to a steady-state logic signal. Referring to FIGS. 1 and 2, assume that the data input to true complement generator 20 is at a down level. In FIG. 2, the data is shown as a steady-state logic input, however, it is obvious that it could also be a pulsating logic level from previous dynamic logic stages. With the data at a down level, FET Q23 is off. The first clock phase pulse designated as phase 1, is applied to the gate of Q25. At this time, all other clock-phase pulses, e.g. phase 2, phase 3 and phase 4 are down causing Q21, Q22, and Q24 to be off. Based on previous clock-phase pulses, point A is at an up level which also causes Q26 to be on. With both Q25 and Q26 on, point B is at a down level.

At phase 2 time, meaning the occurrence of the clock-phase 2 pulse, Q12 and Q14 are both turned on, transferring the signal from point A to the gate of Q16 and from point B to the gate of Q18. The up signal at the gate of Q16 will turn Q16 on while the down signal at the gate of Q18 will turn Q18 off. Since this was already the apparent state of Q16 and Q18, there is no change in their state during this clock-phase interval. With Q16 on, the output pulse will be up, based on a positive biased potential for terminal +V. Note that in this case, the output pulse is the inverted phase of the data. If it were desired to have a non-inverting buffer, it is a matter of a simple wiring change. For example, point A could be connected to Q14 and point B to Q12, or in the alternative, the output of Q12 could be connected to Q18 and the output of Q14 to the input of Q16. For purposes of this example, the buffer is shown as providing an inverted output.

During clock-phase 3 time, Q21 is turned on charging parasitic capacitor C1 as well as the parasitic capacitance associated with Q22 and maintains Q26 in its on state. The charging of parasitic capacitor C1 is indicated by the pulsating of the voltage at point A, and maintains point A at an up level. At the occurrence of the phase 4 clocking pulse, Q24 and Q22 are turned on. This charges parasitic capacitor C3 as indicated in the waveform for point B. The next occurrence is the clock-phase 1 pulse which turns Q25 on again, thereby providing the discharge path for capacitor C3 through Q25 and Q26 (which is still on, based on the up level at point A). Hence, the potential level at point B returns to the down level. The occurrence of clock-phase pulse 2 will again provide the previously described read-out based on the down level of the signal input.

With continued reference to FIG. 2, note the time of occurrence at which the data input signal is changed to the up level. This event will turn Q23 on. Clock-phase pulse 3 occurring at approximately the same time, will again turn on Q21 charging capacitor C1 and maintaining Q26 on. At the occurrence of the clock-phase 4 pulse, however, Q22 is turned on and since Q23 is already on, based on the up level of the input data, the line including point A is brought to the down level discharging capacitor C1. The phase 4 clock pulse also turns Q24 on charging capacitor C3. Since at clock-phase pulse 4 time, Q25 is off, there is no discharge path provided for capacitor C3. Also, note that when point A is brought to the down level, Q26 is also turned off. Thus, at the occurrence of clock phase 1 time, even though Q25 is turned on, there is no discharge path provided for C3. The small down turn in the waveform of point B at this instant of time is occasioned by a transfer of a small amount of energy through Q25 to charge the parasitic capacitance at the node of Q25 and Q26. At the occurrence of clock-phase pulse 2, therefore, Q12 and Q14 are turned on transferring the now down level to Q16 and now up level to Q18, turning Q16 off and Q18 on. This results in a down level output.

Figure 4:
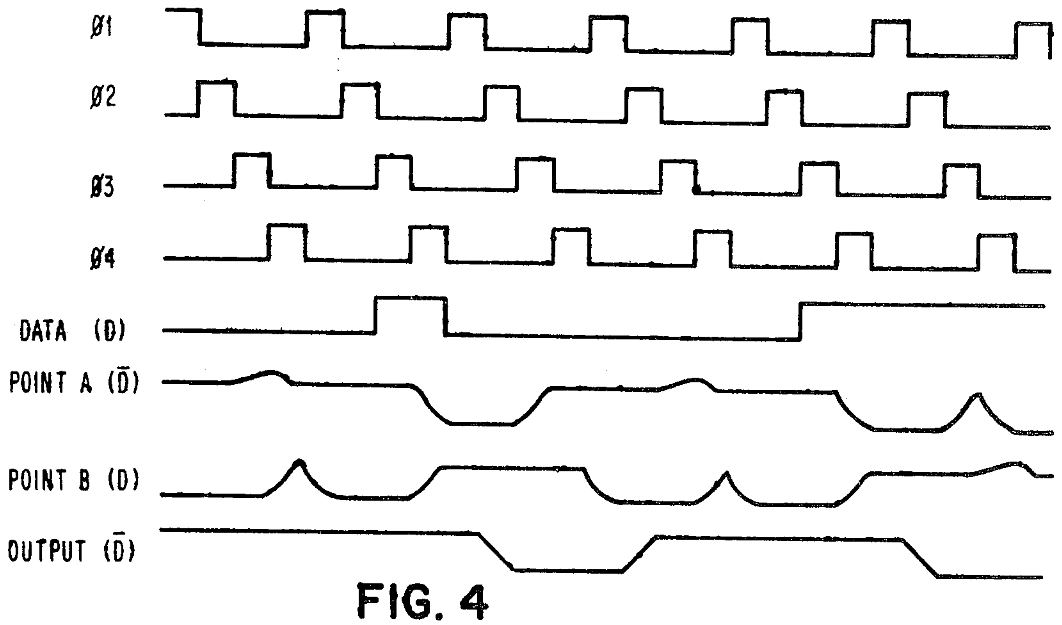
FIG. 4 is a series of waveform diagrams depicting the operation of the circuit of FIG. 3.

Refer now to FIGS. 3 and 4 for a description of additional alternate embodiments. At the beginning of the waveform diagrams in FIG. 4, the data is at a down level. The phase 3 clock pulse causes point A to have a slight up pulsation and the phase 4 clock pulse causes point B to have a significant up pulsation. However, the occurrence of clock phase pulse 1 turns Q25 on providing a discharge path from point B to the phase 4 down level through Q26. Q26, of course, is on, based on the up level at point A. Note that FET's Q21 and Q24 are connected to operate as diodes. The phase 2 clock pulse turns Q12 and Q14 on, transferring the up level at point A and the down level at point B to the gates of Q16 and Q18 respectively. The up level from point A turns Q16 on (or rather keeps it on since it was already in its on state) causing the output to be at an up level. The next event is the occurrence of the data and clock-phase 3. The up level of data turns Q23 on while the clock-phase pulse 3 passing through Q21 turns Q26 on and pre-charges the parasitic capacitor of Q12. The data at the input is still present at the occurrence of the clock phase 4 pulse. At this time, therefore, Q22 and Q23 are both on, discharging the parasitic capacitance associated with the line including point A to the down level, turning Q26 off. The up level of the phase 4 clock pulse is conducted through Q24 charging the parasitic capacitor associated with Q14, thereby bringing point B to an up level. The subsequent occurrence of the phase 1 clock pulse turns Q25 on with no effect since Q26 is off. The occurrence of the clock phase 2 pulse then gates the new levels at point A and B to Q16 and Q18 bringing the output to the down level as previously described. At the occurrence of the very next clock phase 3 pulse, however, the input data is already at the down level. Accordingly, the up level of the phase 3 clock pulse is conducted through Q21 and brings point A to an up level. The occurrence of the clock phase 4 pulse is transmitted through Q24 maintaining point B at an up level. The occurrence of the clock phase 1 pulse turns Q25 on, providing a discharge path from point B through Q25 and Q26 to the phase 4 level which at this time is down. At the occurrence of the sampling pulse which is the clock phase 2 pulses in this example, the output of the buffer is again brought to an up level.

Refer now to FIG. 5 for an alternate embodiment of the true complement generator. In operation, the phase 1, 2, 3 and 4 clock pulses occur as previously described. The input data can again be assumed to occur during phase 3 and 4 time as in previous embodiments. Assuming the data is at an up level at the occurrence of phase 3 time, the phase 3 clock pulse will bring point 14 to an up level turning Q25 on. With Q25 on, point B will unconditionally discharge. At the occurrence of the phase 4 clock pulse, Q22 is turned on and since Q23 is still on, a discharge path is provided from point A to the down level provided on the phase 3 clock line. At the same time point B precharges through Q24 and remains charged at the end of phase 4 and during phase 1. Therefore, at the occurrence of the sampling pulse, point B will be at an up level while point A will be at a down level. Conversely, if it were assumed that the input data is at a down level, then Q23 remains off during clock phase 3 time when the line leading to point A is brought to an up level. The up level at point A turns Q25 off providing a discharge path for point B. Point B, however, will precharge during phase 4 through Q24. A discharge path will be provided during the end of phase 4 since the data at point A remained high, i.e. Q23 was off. Data at points A and B are at an equilibrium point during phases 1 and 2. Since data is sampled during phase 2, a valid output level is obtained.

What has then been described is a dynamic logic buffer for interfacing pulsating logic which results from multi-phase dynamic circuits and providing steady-state logic levels to subsequent current driven circuits. Although an example of four-phase dynamic logic has been used, this invention could be embodied in circuits employing a different number of phases. Accordingly, while the invention has been particularly shown and described with reference to preferred embodiments, it will be understood by those skilled in the art that various changes in form and detail may be made therein without departing from the spirit and scope of the invention.

What is claimed is:

1. A buffer circuit for interfacing multiphase dynamic logic circuits with circuits adapted to receive steady state logic signals, comprising:

a first field effect transistor having drain, gate, and source regions having its drain connected to the true phase of a pulsating signal;

a second field effect transistor having drain, gate and source regions with its drain connected to the complement phase of said pulsating signals;

a common connection between the gate of each of said field effect transistors adapted to receive a gating signal at an instant of time when both said true and complement phases of said pulsating signal are at an equilibrium state;

a third field effect transistor having source, gate, and drain regions and having its gate connected to the source of one of said first two field effect transistors;

a fourth field effect transistor having drain, gate, and source regions and having its gate connected to the other one of the said first two field effect transistors;

the source of said third field effect transistor being connected to the drain of said fourth field effect transistor by a conductive connection, said connection also providing an output signal;

the drain of said third field effect transistor being further connected to a first steady state source of potential; and the source of said fourth field effect transistor being connected to a second source of potential said second source of potential being more negative than said first source of potential.

2. A buffer circuit as in claim 1 further comprising:
input means for providing true and complement phases of a multi-phase pulsating dynamic logic signal.

3. A buffer circuit as in claim 1 in which said buffer circuit is placed on the same monolithic chip with multiphase dynamic logic circuits.

4. A buffer circuit for interfacing four phase dynamic logic circuits with circuits adapted to receive steady state logic signals, comprising:
a first field effect transistor having source, gate, and drain regions;
a second field effect transistor having drain, gate and source regions having its drain connected to the source of said first field effect transistor;
an output node connected to the common connection between said first and second field effect transistors;
means for rendering said first field effect transistor conductive only in response to the true value of an input signal;
means for rendering said second field effect transistor conductive only in response to the complement value of said input signal;
means for connecting the drain of said first field effect transistor to a first potential source;
means for connecting the source of said second field effect transistor to a second potential source; and
means connected to an input of both said first and said second field effect transistors for altering the output signal at said output node during only one phase time out of the four phases of the said four phase dynamic logic circuit;
thereby electrically connecting the output node to one of the said potential sources, at least during an interval of time when an output is desired.

5. A buffer circuit for interfacing multi-phase dynamic logic circuits with circuits adapted to receive steady state logic signals, comprising:
complement generating means for receiving an input signal and providing both true and complement phases of said input signal at its output;
a first field effect transistor having an input electrode, an output electrode, and a gating electrode having its input connected to the true output of said complement generating means;
a second field effect transistor having input, output, and gate electrodes having its input electrode connected to the complement output of said complement generating means;
a gating signal connected simultaneously to both said gate electrodes for transferring the signals at both said input electrodes to the said respective output electrodes;
capacitive means for storing the said signals at the said output electrodes;
a third field effect transistor having drain, gate, and source electrodes and having its gate electrode connected to the output electrode of said first field effect transistor;
a fourth field effect transistor having drain, gate, and source electrodes and having its gate electrode connected to the output electrode of said second field effect transistor;
an output node connected to a common connection between the source electrode of said third field effect transistor and the drain electrode of said fourth field effect transistor;
means for connecting the drain of said third field effect transistor to a first source of potential; and
means for connecting the source electrode of said fourth field effect transistor to a second source of potential.

* * * * *